(12) United States Patent
Sukhman et al.

(10) Patent No.: US 8,101,883 B2
(45) Date of Patent: Jan. 24, 2012

(54) LASER-BASED MATERIAL PROCESSING SYSTEMS AND METHODS FOR USING SUCH SYSTEMS

(75) Inventors: Yefim P. Sukhman, Scottsdale, AZ (US); Christian J. Risser, Scottsdale, AZ (US)

(73) Assignee: Universal Laser Systems, Inc., Scottsdale, AZ (US)

( * ) Notice: Subject to any disclaimer, the term of this patent is extended or adjusted under 35 U.S.C. 154(b) by 1538 days.

(21) Appl. No.: 11/413,454

(22) Filed: Apr. 27, 2006

(65) Prior Publication Data
US 2007/0251929 A1 Nov. 1, 2007

(51) Int. Cl.
*B23K 26/38* (2006.01)
(52) U.S. Cl. .............................. 219/121.67; 219/121.72
(58) Field of Classification Search ............. 219/121.78, 219/121.79, 121.67, 121.72, 121.61, 121.62, 219/121.6; 264/400, 482
See application file for complete search history.

(56) References Cited

U.S. PATENT DOCUMENTS

| | | | |
|---|---|---|---|
| 4,693,778 A | 9/1987 | Swiggett et al. | |
| 4,818,322 A | 4/1989 | Morino et al. | |
| 4,899,924 A | 2/1990 | Kawaguchi | |
| 4,900,379 A * | 2/1990 | Chapman | 700/167 |
| 5,051,558 A * | 9/1991 | Sukhman | 219/121.68 |
| 5,164,565 A * | 11/1992 | Addiego et al. | 219/121.68 |
| 5,215,864 A | 6/1993 | Laakmann | |
| 5,998,758 A | 12/1999 | Moser et al. | |
| 6,007,929 A | 12/1999 | Robertson et al. | |
| 6,191,379 B1 | 2/2001 | Offer et al. | |
| 6,313,433 B1 | 11/2001 | Sukhman et al. | |
| 6,491,361 B1 * | 12/2002 | Spann | 219/121.67 |
| 6,618,563 B2 | 9/2003 | Oakeson et al. | |
| 6,887,313 B2 | 5/2005 | Russ | |
| 2002/0002416 A1 * | 1/2002 | Herman, Jr. | 700/135 |
| 2002/0106208 A1 | 8/2002 | Oakeson | |
| 2004/0066441 A1 | 4/2004 | Jones et al. | |
| 2004/0226929 A1 * | 11/2004 | Miura et al. | 219/121.85 |

(Continued)

FOREIGN PATENT DOCUMENTS

CA 2520301 7/2004

(Continued)

OTHER PUBLICATIONS

Machine translation of Japan Patent document No. 11-291,606, Jun. 2009.*

*Primary Examiner* — Geoffrey S Evans
(74) *Attorney, Agent, or Firm* — Perkins Coie LLP

(57) ABSTRACT

Laser-based material processing systems and methods for using such systems are disclosed herein. In one embodiment, for example, a laser-based material processing system includes a workpiece support, a positioning assembly over at least a portion of the workpiece support, and a laser. The system includes a laser beam director carried by the positioning assembly to direct a beam generated by the laser toward the workpiece support. The system also includes a dispensing unit carried by the positioning assembly to discharge a material toward the workpiece support. The system further includes a controller operably coupled to the positioning assembly, the laser beam director, and the dispensing unit. The controller can be configured to move the laser beam director and the dispensing unit relative to the workpiece support such that (a) the beam is directed toward a first portion of the workpiece support, and (b) the dispensing unit discharges material toward the first portion of the workpiece support.

27 Claims, 4 Drawing Sheets

U.S. PATENT DOCUMENTS

| | | |
|---|---|---|
| 2005/0121428 A1 | 6/2005 | Risser et al. |
| 2006/0006157 A1 | 1/2006 | Oldani |
| 2006/0023046 A1* | 2/2006 | Miura et al. ................ 347/102 |
| 2006/0081576 A1 | 4/2006 | Lambert et al. |

FOREIGN PATENT DOCUMENTS

| | | |
|---|---|---|
| JP | 03-138092 A * | 6/1991 |
| JP | 11-291606 A * | 10/1999 |
| WO | WO-00/61301 A1 * | 10/2000 |

\* cited by examiner

LASER-BASED MATERIAL PROCESSING SYSTEMS AND METHODS FOR USING SUCH SYSTEMS

TECHNICAL FIELD

The present invention is directed generally toward laser-based material processing systems and methods for using such systems.

BACKGROUND

Lasers are ubiquitous devices used for testing, measuring, printing, cutting, marking, medical applications, communications, data transmission, semiconductor processing, and a number of other applications. Many types of lasers have been developed to meet different performance criteria for different applications. Engraving, cutting, marking, printing, and many other applications require relatively compact lasers that generate high power outputs and have beams with a desired shape and energy distribution. Laser-based engraving and imaging systems, for example, are often used to engrave or otherwise form ornamental designs, such as text, logos, or other ornamental designs, on and/or in workpieces formed from various materials (e.g., plastics, wood, rubber, paper, etc.).

In some applications, the portions of the workpiece irradiated or otherwise affected by the laser can be filled or at least partially covered with ink, paint, and/or other suitable materials. Several different processes can be used to deposit ink or paint onto the workpiece. In some conventional applications, for example, the workpiece can be painted by hand. In other applications, a mask can be created that generally matches at least a portion of the logo or design on the workpiece. The ink or paint can then be applied to the workpiece using one or more spraying steps. If more than one color is required, several masking/spraying steps may be required.

In other applications, a material may need to be applied to a surface of the workpiece prior to irradiating the workpiece with the laser so that the laser energy can fuse the applied material to the workpiece or in some other way affect the applied material to mark the workpiece. Examples of this can include inks applied to circuit boards and subsequently fused to the surface by a laser beam to form a bar code or serial number, ceramic powders applied to metal materials and then fused to the surface by a laser beam, and UV-curable materials applied to the surface of a circuit board and then cured with a laser to form a mask before etching the unprotected areas of the circuit board in a chemical bath. Conventional methods for applying such materials generally include applying the materials manually by hand spraying or painting them onto the surface of the workpiece.

In still other applications, a material may need to be applied to a surface of the workpiece to aid in the marking or cutting process performed by the laser beam. Examples of this can include water applied to the surface of an acrylic or wooden material to prevent discoloration of the unmarked area adjacent to a marked area and slightly acidic or alkaline materials applied to the surface of a stone material to help discolor the stone when it is etched by the laser beam to provide more contrast between the marked and unmarked areas.

Conventional methods such as those described above for depositing materials onto a workpiece, however, include several drawbacks. Manually applying material onto the workpiece, for example, is very labor-intensive and can significantly reduce throughput of processed workpieces. Furthermore, in some applications it may not be suitable to manually apply a particular material onto the workpiece. The masking approach also includes several drawbacks. For example, masking and spraying the workpiece is also labor-intensive because it can require a series of additional process steps. Furthermore, forming the masks can be relatively expensive and require a significant amount of time. Accordingly, there is a need to improve the systems and methods for processing workpieces.

DETAILED DESCRIPTION

A. Overview

Figure 1:
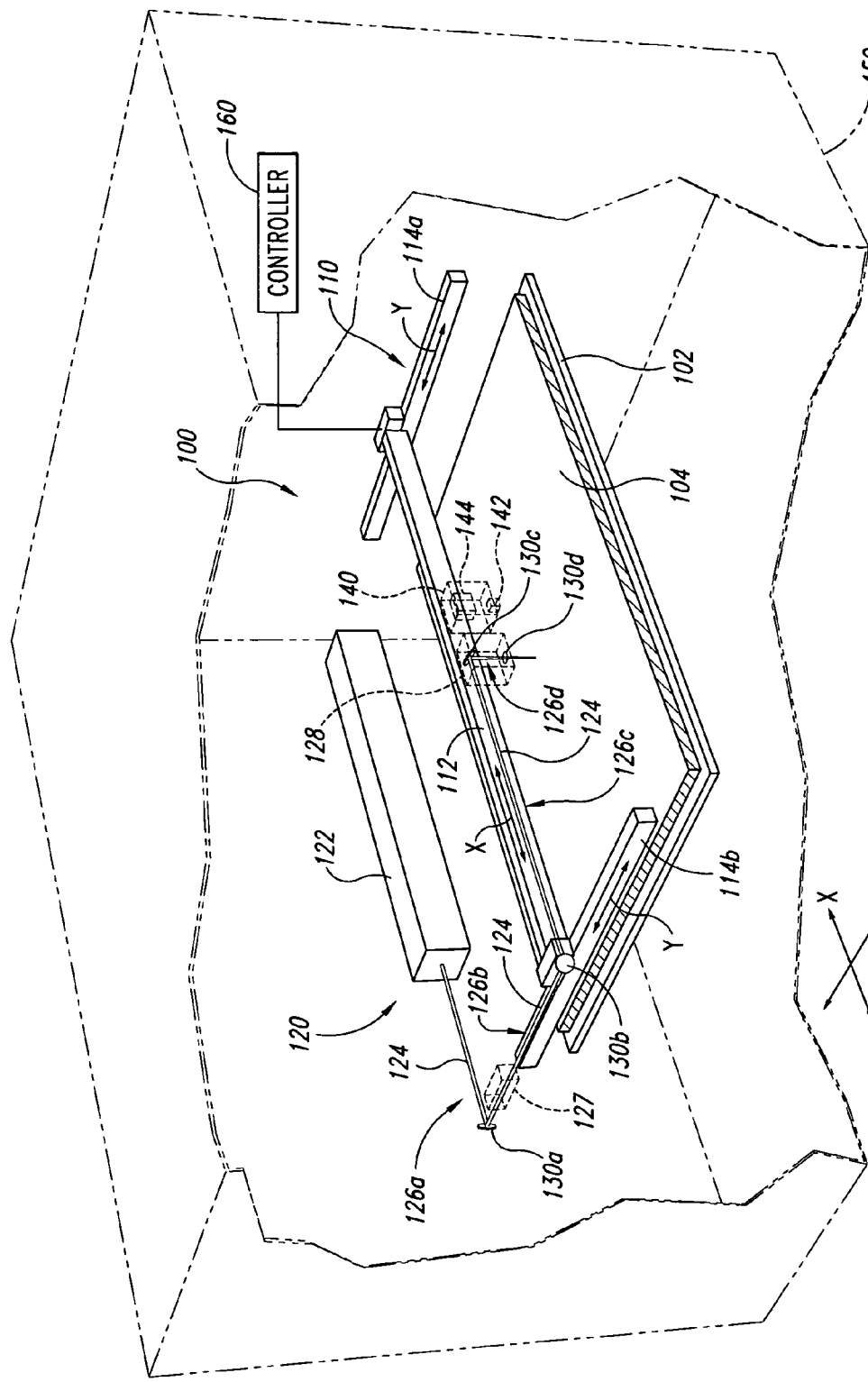
FIG. 1 is a partially schematic, isometric view of a laser-based material processing system in accordance with an embodiment of the invention.

The present invention is directed toward laser-based material processing systems and methods for using such systems. One embodiment of the invention, for example, is directed to a laser-based material processing system including a workpiece support, a positioning assembly over at least a portion of the workpiece support, and a laser. The system includes a laser beam director carried by the positioning assembly to direct a beam generated by the laser toward the workpiece support. The system also includes a dispensing unit carried by the positioning assembly to discharge a material toward the workpiece support. The dispensing unit can be configured to discharge a number of different materials onto a workpiece carried by the workpiece support. The system further includes a controller operably coupled to the positioning assembly, the laser beam director, and the dispensing unit. The controller can be configured to move the laser beam director and the dispensing unit relative to the workpiece support such that (a) the beam is directed toward a first portion of the workpiece support, and (b) the dispensing unit discharges material toward the same first portion of the workpiece support.

The system can have several different configurations. In one embodiment, for example, the positioning assembly includes an arm extending along a first axis. The laser beam director and dispensing unit are both carried by the arm and can each move in a coordinated manner along the arm in a direction generally parallel with the first axis. The arm itself is configured to move along a second axis generally normal to the first axis. In another embodiment, the positioning assembly includes (a) a first arm extending along a first axis, and (b) a second arm extending along a third axis generally parallel with the first axis. The laser beam director is carried by the first arm and can move along the first arm in a direction generally parallel with the first axis. The dispensing unit is carried by the second arm and can move along the second arm in a direction generally parallel with the third axis. The first and second arms can each move along a second axis generally normal to the first and third axes.

Several embodiments of the invention are also directed toward methods for processing workpieces. For example, one embodiment of a method in accordance with the invention includes irradiating a portion of a generally nonporous workpiece with a laser beam positioned by a beam director carried at least in part by a support assembly over the workpiece. The method also includes depositing a material onto the workpiece with a dispensing unit carried by the support assembly. The laser beam can irradiate the workpiece either before, after, or simultaneous with the dispensing unit depositing the material onto the workpiece. Furthermore, the material can be deposited (a) onto the irradiated portion of the workpiece, (b) onto a portion of the workpiece outside the irradiated portion, or (c) both.

Many specific details of certain embodiments of the invention are set forth in the following description and in FIGS. 1-4 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

B. Embodiments of Laser-Based Material Processing Systems and Methods for Using Such Systems FIG. 1 is a partially schematic, isometric view of a laser-based material processing system 100 in accordance with an embodiment of the invention. The system 100 includes a positioning assembly or support assembly 110 over at least a portion of a workpiece support 102. A workpiece 104 is carried by the workpiece support 102 and positioned at a desired location relative to the positioning assembly 110 for processing. The system 100 also includes (a) a laser assembly 120 configured to direct a radiation beam toward the workpiece 104 to irradiate or otherwise affect (e.g., engrave, cut, etch, etc.) at least a portion of the workpiece 104, and (b) a dispensing unit 140 (shown schematically in broken lines) configured to discharge a material (not shown) toward the workpiece support 102 and onto at least a portion of the workpiece 104. The term "workpiece" is defined herein as any type of material by itself or in combination with one or more additional materials that can be irradiated, modified, or otherwise affected by a radiation beam. In several embodiments, for example, the workpiece 104 can include a generally nonporous material, such as metal, wood, plastic, rubber, and/or other suitable materials.

In the illustrated embodiment, the positioning assembly 110 includes a gantry having a movable arm 112 carried by two generally parallel, stationary rails or guides 114 (shown as a first rail 114a and a second rail 114b). The arm 112 extends along a first axis X and the two rails 114a and 114b each extend along a second axis Y generally normal to the first axis X. In this way, the arm 112 can move back and forth along the rails 114a and 114b in a direction generally parallel with the second axis Y to a desired location with respect to the workpiece 104 and/or workpiece support 102. In other embodiments described below with respect to FIGS. 2-4, the positioning assembly 110 can have different configurations.

The laser assembly 120 includes a radiation source 122 configured to generate a beam of radiation 124 having a desired configuration (i.e., size, shape, energy distribution, etc.). The radiation source 122 can be any of a variety of radiation sources known in the art, such as a gas laser, a solid state laser, a semiconductor laser, a dye laser, a fiber laser, or a combination of these lasers. In other embodiments, the radiation source 122 can also include other types of suitable laser systems and/or lamps. The nature of the source depends upon the intended application. In still further embodiments, the laser assembly 120 can include more than one radiation source 122.

The radiation beam 124 is directed along radiation paths 126a-c using optical elements 130a and 130b. The optical elements 130a and 130b can include lenses, mirrors, or other suitable optical members that redirect and/or condition the radiation beam 124 as it travels along the radiation paths 126a-c. In other embodiments, the laser assembly 120 can include a different number of optical elements 130 and/or the optical elements 130 can have a different arrangement along the radiation paths 126a-c.

The laser assembly 120 also includes a laser beam director 128 (shown schematically in broken lines) movably carried by the arm 112 of the positioning assembly 110. The laser beam director 128 includes one or more additional optical elements 130 (two are shown as optical elements 130c and 130d) to direct the radiation beam 124 from radiation path 126c along a radiation path 126d toward a desired portion of the workpiece 104. In other embodiments, the laser beam director 128 can include a different number of optical elements 130 and/or the optical elements can have a different arrangement.

The laser assembly 120 can further include a collimator 127 (shown schematically in broken lines) positioned at a desired location along the radiation paths 126a-c between the radiation source 122 and the workpiece 104. The collimator 127 is configured to reduce the divergence of the radiation beam 124 for maintaining the spot size of the radiation beam 124 within a desired range as the beam travels from the radiation source 122 toward the workpiece 104. In other embodiments, the collimator 127 can have a different arrangement and/or the laser assembly 120 can include a different number of collimators. In still further embodiments, the laser assembly 120 may not include the collimator 127.

The arm 112 of the positioning assembly 110 also carries the dispensing unit 140. The dispensing unit 140 can include a dispensing member 142 and one or more reservoirs 144 (only one is shown in the illustrated embodiment) operably coupled to the dispensing member 142. The reservoir 144 is configured to hold the material (not shown) to be dispensed onto the workpiece 104. The material, for example, can include a liquid, powder, paste, ink, adhesive, polymer, or a variety of other types of dispensable materials. In one embodiment, for example, the dispensing member 142 can include an inkjet print head and the one or more reservoirs 144 can include one or more ink reservoirs filled with desired colors of ink. In other embodiments, the dispensing unit 140 can include other types of dispensing members 142 and/or reservoirs 144 to dispense other types of materials onto the workpiece 104. In an embodiment discussed in detail below with respect to FIG. 4, for example, a reservoir for the dispensing unit is located apart from the dispensing unit and the material is provided to the dispensing unit with a feed mechanism.

The system 100 can also include a controller 160 (shown schematically) configured to control movement of the laser beam director 128 and dispensing unit 140 relative to the workpiece 104 and workpiece support 102. More specifically, the laser beam director 128 and the dispensing unit 140 are configured to move in a coordinated manner along the arm 112 in a direction generally parallel with the first axis X. Further, as discussed previously, the arm 112 itself can move along the rails 114a and 114b in a direction generally parallel to the second axis Y. In this way, the radiation beam 124 and the dispensing member 142 of the dispensing unit 140 can be directed to any desired X, Y coordinate on the workpiece 104 for processing. In other embodiments, the laser beam director 128 and the dispensing unit 140 can move sequentially rather than in tandem.

In the illustrated embodiment, the system 100 is contained within a housing 150 (shown in broken lines). The housing 150 can be any type of suitable enclosure for holding the various components of the system 100 described previously. In other embodiments, the housing 150 may have a different configuration or the housing may be excluded altogether.

In operation, the laser beam director 128 and the dispensing unit 140 function together to process the workpiece 104. For example, the radiation beam 124 can irradiate or otherwise modify the workpiece 104 either before, after, or simultaneous with the dispensing unit 140 depositing the material onto the workpiece 104. The material dispensed from the dispensing unit 140 can be deposited (a) onto the irradiated portion of the workpiece 104, (b) onto a portion of the workpiece 104 outside the irradiated portion, or (c) both. For example, the radiation beam 124 can irradiate a first portion of the workpiece 104 and a second portion of the workpiece 104 immediately adjacent to and in contact with the first portion. The dispensing unit 140 can then dispense material onto both the first portion and the adjacent second portion. In further embodiments, the laser assembly 120 can be used to irradiate the workpiece 104 without a material being dispensed onto the workpiece using the dispensing unit 140. Moreover, the dispensing unit 140 can be used to deposit a material onto the workpiece 104 without having to irradiate or otherwise affect the workpiece with the laser assembly 120 before the material is applied.

One feature of the system 100 described above is that the laser beam director 128 and the dispensing unit 140 are both carried by the positioning assembly 110 and configured to process the workpiece 104 together. As discussed previously, conventional methods for depositing material onto a workpiece often include manually applying the material to the workpiece. Such manual processes can be extremely time-consuming and labor-intensive. In contrast, the dispensing unit 140 of the system 100 can automatically apply a material to the workpiece simultaneous with or at least almost simultaneous with the laser assembly 120 irradiating various portions of the workpiece 104. This feature is expected to significantly improve throughput of processed workpieces, as well as reduce the time and cost required to process workpieces.

Another advantage of the system 100 is that the system can operate efficiently and with high precision because both the laser assembly 120 and the dispensing unit 140 are in a single system. For example, after irradiating the workpiece 104 with the laser assembly 120, the dispensing unit 140 can deposit the material onto the workpiece 104 without moving the workpiece to a different tool and realigning the workpiece. It will be appreciated that moving the workpiece to a different tool as required by many conventional processes is time-consuming and can contaminate or cause damage to the workpiece. Moreover, the realignment process in conventional systems can be extremely time-consuming because the workpiece must be aligned precisely to avoid potential errors in depositing material onto the desired portions of the workpiece. Because the system 100 does not require the workpiece to be moved after irradiation and before the material is applied to the workpiece, the system 100 is expected to (a) significantly reduce the time required to process a workpiece, and (b) eliminate a source of potential errors from misalignment of the workpiece.

Figure 2:
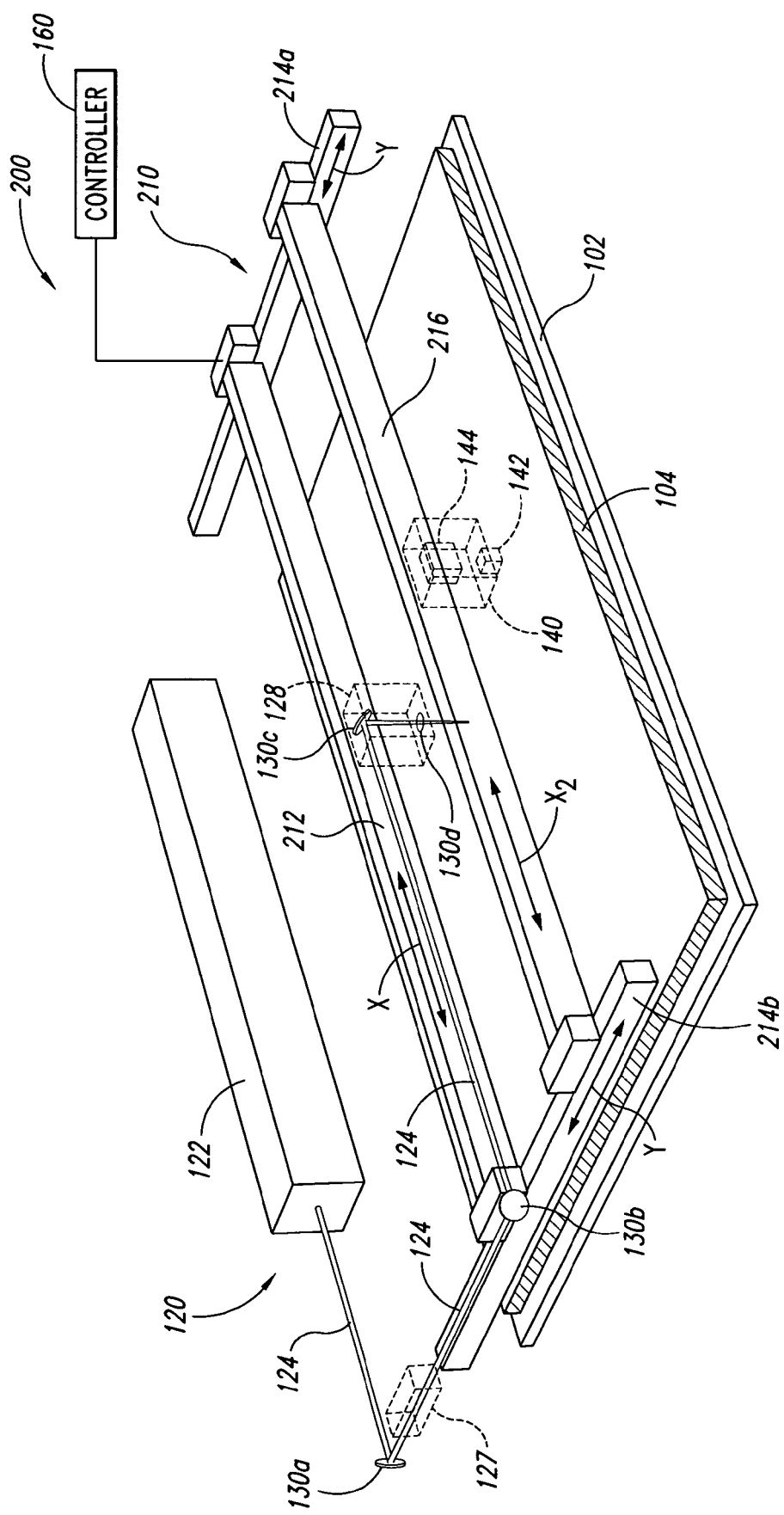
FIG. 2 is a partially schematic, isometric view of a laser-based material processing system in accordance with another embodiment of the invention.
Figure 3:
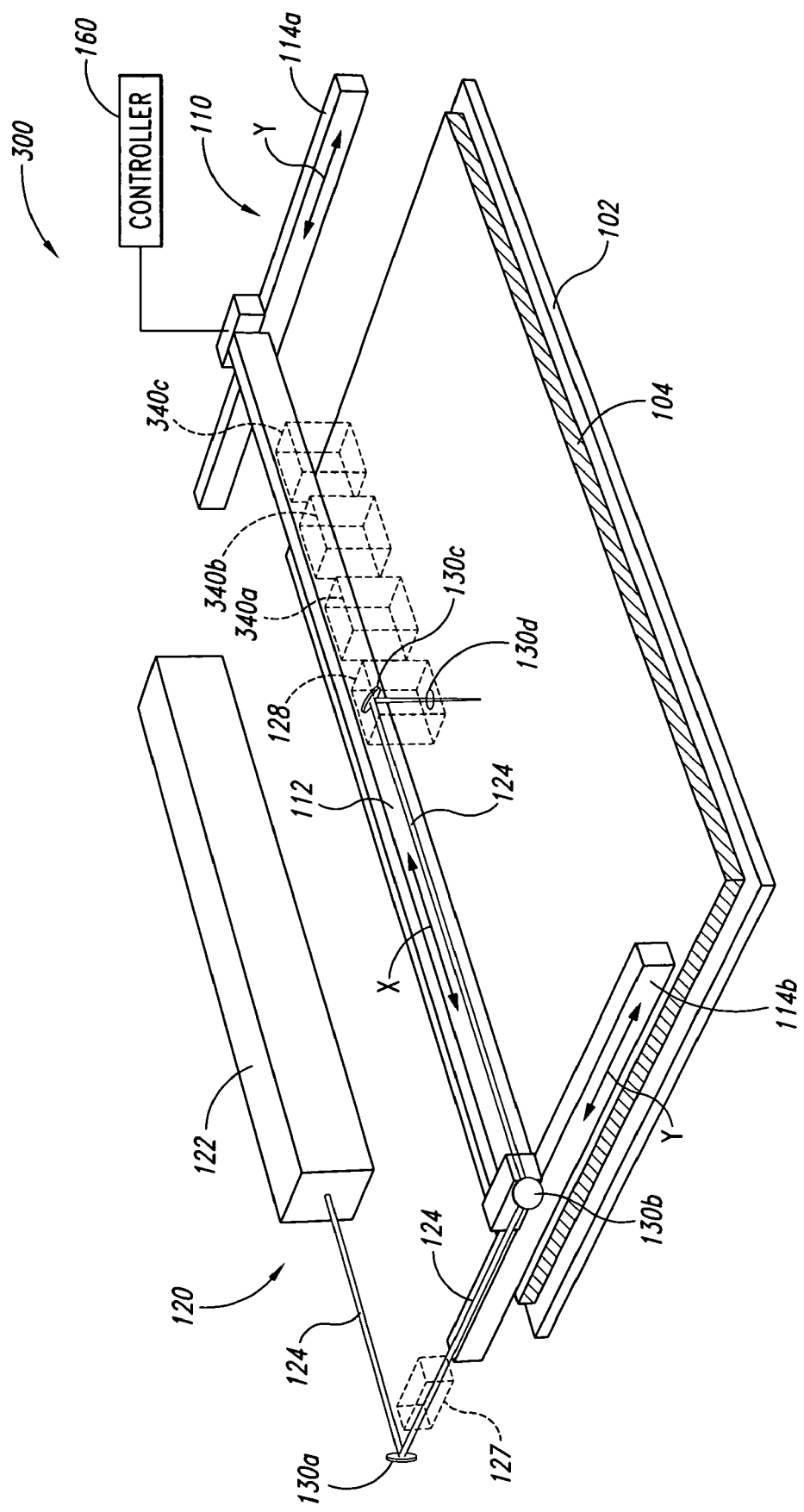
FIG. 3 is a partially schematic, isometric view of a laser-based material processing system in accordance with yet another embodiment of the invention.
Figure 4:
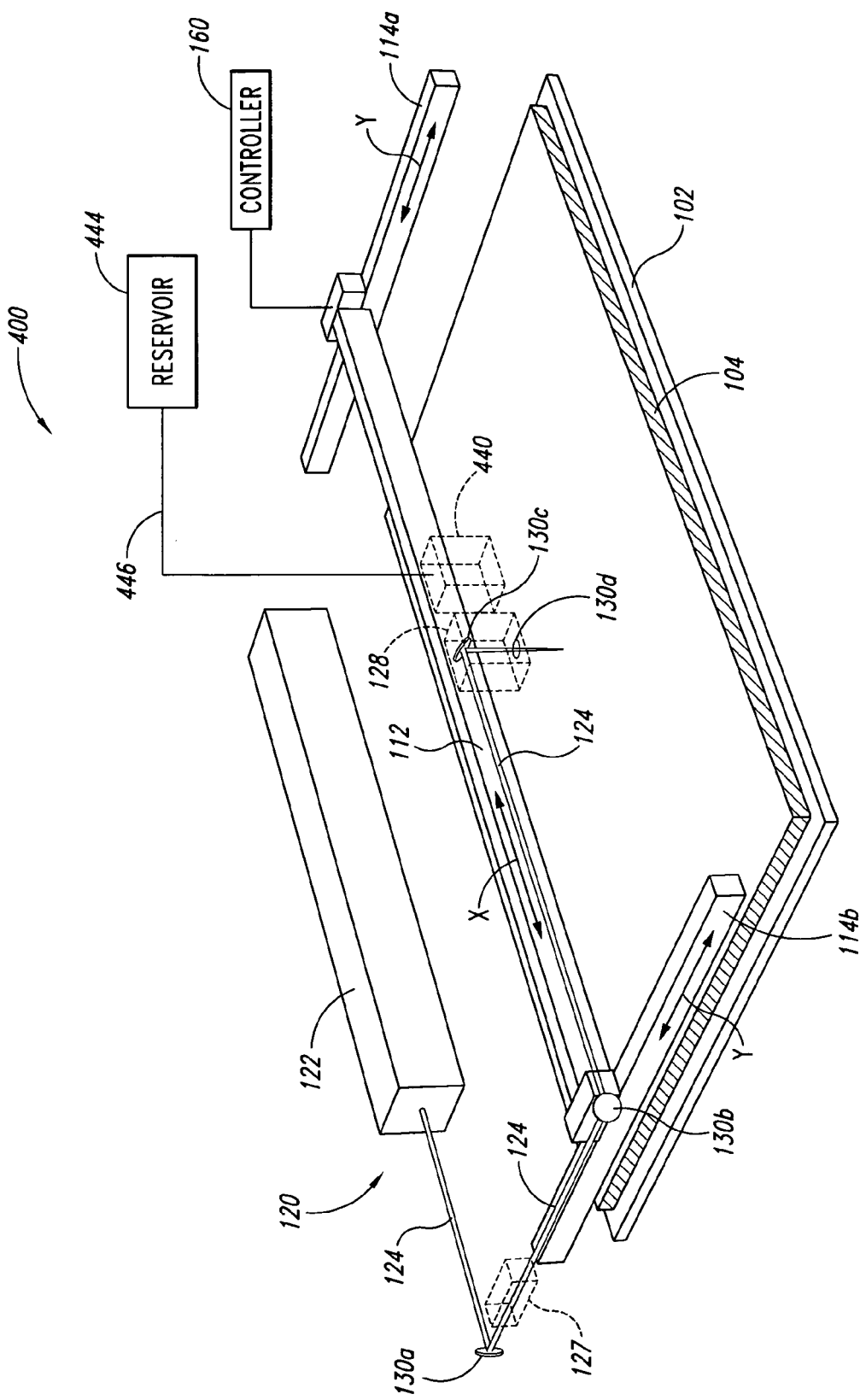
FIG. 4 is a partially schematic, isometric view of a laser-based material processing system in accordance with still another embodiment of the invention.

C. Additional Embodiments of Laser-Based Material Processing Systems and Methods for Using Such Systems FIGS. 2-4 illustrate laser-based material processing systems in accordance with several additional embodiments of the invention. These systems can include several features generally similar to the system 100 described above with respect to FIG. 1. Accordingly, like reference numbers are used to refer to like components in FIG. 1 and FIGS. 2-4. The systems described below can also have many of the same advantages as the system 100 described above with respect to FIG. 1.

FIG. 2, for example, is a partially schematic, isometric view of a laser-based material processing system 200 in accordance with another embodiment of the invention. The system 200 can be generally similar to the system 100 described above with respect to FIG. 1. The system 200 differs from the system 100, however, in that the system 200 includes a positioning assembly 210 having a different configuration than the positioning assembly 110. More specifically, the positioning assembly 210 includes a first movable arm 212 carried by two generally parallel, stationary rails or guides 214 (shown as a first rail 214a and a second rail 214b). The first arm 212 extends along the first axis X and the two rails 214a and 214b each extend along the second axis Y. The positioning assembly 210 further includes a second arm 216 carried by the rails 214a and 214b. The second arm 216 extends along a third axis $X_2$ generally parallel to the first axis X. The first and second arms 212 and 216 can each move back and forth along the rails 214a and 214b in a direction generally parallel with the second axis Y. In the illustrated embodiment, the laser beam director 128 is carried by the first arm 212 and the dispensing unit 140 is carried by the second arm 216. In other embodiments, however, the first arm 212 can carry the dispensing unit 140 and the second arm 216 can carry the laser beam director 128.

FIG. 3 is a partially schematic, isometric view of a laser-based material processing system 300 in accordance with yet another embodiment of the invention. The system 300 differs from the system 100 described above with respect to FIG. 1 in that the system 300 includes a plurality of dispensing units 340 (three are shown as dispensing units 340a-c) carried by the positioning assembly 110, rather than just a single dispensing unit as in the system 100. The dispensing units 340a-c are each configured to deposit a material onto desired portions of the workpiece 104. In one embodiment, for example, the dispensing units 340a-c can include three different inkjet print heads containing three different colors of ink. In other embodiments, the dispensing units 340a-c can be configured to deposit a number of different materials onto the workpiece 104 and/or the dispensing units 340a-c can have a different arrangement within the system 300.

FIG. 4 is a partially schematic, isometric view of a laser-based material processing system 400 in accordance with still another embodiment of the invention. The system 400 can include several features generally similar to the system 100 described above with respect to FIG. 1. The system 400, for example, includes a dispensing unit 440 carried by the positioning assembly 110 and configured to deposit a material onto the workpiece 104. The dispensing unit 440 in the illustrated embodiment, however, includes a reservoir 444 (shown schematically) positioned apart from the dispensing unit 440. The reservoir 444 is operably coupled to the dispensing unit 440 with a feed mechanism 446. One feature of the system 400 is that reservoir 444 can hold a significantly larger volume of material as compared with a reservoir carried by the dispensing unit 440 itself. An advantage of this feature is that the throughput of processed workpieces can be significantly increased as compared with systems including smaller reservoirs because the reservoir 444 will not need to be refilled as often. This feature, for example, can be particularly desirable in certain industrial applications where the system 400 is expected to process a large number of workpieces.

From the foregoing, it will be appreciated that specific embodiments of the invention have been described herein for purposes of illustration, but that various modifications may be made without deviating from the spirit and scope of the invention. For example, the laser beam director 128 and the dispensing unit 140 (described above with respect to FIG. 1) can both be integral components of a single processing unit configured to move along the arm 112 to process the workpiece 104. Aspects of the invention described in the context of particular embodiments may be combined or eliminated in other embodiments. For example, the positioning assembly 210 (FIG. 2) can be used with the system 300 such that the laser beam director 128 is carried by the first arm 212 and the multiple dispensing units 340a-c are carried by the second arm 216. Further, while advantages associated with certain embodiments of the invention have been described in the context of these embodiments, other embodiments may also exhibit such advantages, and not all embodiments need necessarily exhibit such advantages to fall within the scope of the invention. Accordingly, the invention is not limited except as by the appended claims.

We claim:

1. A laser-based material processing system, the system comprising:
   a workpiece support;
   a positioning assembly over at least a portion of the workpiece support;
   a laser;
   a laser beam director carried by the positioning assembly to direct a beam generated by the laser toward the workpiece support;
   a dispensing unit carried by the positioning assembly to discharge a material toward the workpiece support, wherein the material comprises ink; and
   a controller operably coupled to the positioning assembly, the laser beam director, and the dispensing unit, wherein the controller is configured to move the laser beam director and the dispensing unit relative to the workpiece support, and wherein (a) the beam is directed toward a first position of the workpiece support, and (b) the dispensing unit discharges material toward the first position of the workpiece support, and further wherein the beam controller is configured to direct the beam such that the beam is not directed toward the workpiece support simultaneously with the dispensing unit discharging material toward the workpiece support.

2. The system of claim 1, further comprising a workpiece carried by the workpiece support, and wherein the beam directed at the workpiece support is configured to irradiate a portion of the workpiece.

3. The system of claim 2 wherein the controller is configured to position the dispensing unit to discharge the material (a) onto the portion of the workpiece irradiated by the laser beam, (b) onto a portion of the workpiece outside the irradiated portion, or (c) both.

4. The system of claim 2 wherein:
   the controller is configured to position the beam director to irradiate a first portion of the workpiece and a second portion of the workpiece adjacent to and in contact with the first portion of the workpiece; and
   the controller is configured to position the dispensing unit to discharge the material onto the first portion of the workpiece and the second portion of the workpiece.

5. The system of claim 1 wherein:
   the positioning assembly includes an arm extending along a first axis, the arm being configured to move along a second axis generally normal to the first axis;
   the laser beam director is carried by the arm and can move along the arm in a direction generally parallel with the first axis; and
   the dispensing unit is carried by the arm and can move along the arm in a direction generally parallel with the first axis, and wherein the movement of the dispensing unit along the arm is coordinated with the movement of the laser beam director along the arm.

6. The system of claim 1 wherein:
   the positioning assembly includes (a) a first arm extending along a first axis, the first arm being configured to move along a second axis generally normal to the first axis, and (b) a second arm extending along a third axis generally parallel with the first axis and generally normal to the second axis, the second arm being configured to move along the second axis;
   the laser beam director is carried by the first arm and can move along the first arm in a direction generally parallel with the first axis; and
   the dispensing unit is carried by the second arm and can move along the second arm in a direction generally parallel with the third axis.

7. The system of claim 1 wherein the laser beam director and the dispensing unit are housed in a common enclosure.

8. The system of claim 7 wherein the dispensing unit and the laser beam director are integral components of a single processing unit in the common enclosure.

9. The system of claim 1, further comprising a reservoir to hold the material, wherein the reservoir is carried by the dispensing unit.

10. The system of claim 1, further comprising a reservoir to hold the material, wherein the reservoir is spaced apart from the dispensing unit and operably coupled to the dispensing unit with a feed mechanism.

11. The system of claim 1 wherein the dispensing unit includes an inkjet print head.

12. The system of claim 1 wherein the dispensing unit is a first dispensing unit configured to discharge a first material toward the workpiece support, and wherein the system further comprises:
   a second dispensing unit operably coupled to the controller and carried by the positioning assembly to discharge a second material toward the workpiece support.

13. The system of claim 1 wherein the dispensing unit is a first dispensing unit configured to discharge a first material toward the workpiece support, and wherein the system further comprises:
   a plurality of dispensing units operably coupled to the controller and carried by the positioning assembly, wherein the individual dispensing units are each positioned to discharge a material toward the workpiece support.

14. The system of claim 13 wherein the individual dispensing units each include a different material.

15. The system of claim 13 wherein the individual dispensing units each include a different color of ink.

16. The system of claim 1 wherein the laser is a gas laser, a solid state laser, a semiconductor laser, a dye laser, or a fiber laser.

17. A material processing system, comprising:
 radiation means for directing a radiation beam along a radiation path toward a generally nonporous workpiece;
 support means over at least a portion of the workpiece;
 beam positioning means carried by the support means, the beam positioning means including optical elements in the radiation path to direct the radiation beam to the workpiece such that the beam irradiates the workpiece at a first time; and
 dispensing means carried by the support means, the dispensing means positioned to only deposit a material onto the irradiated portion of the workpiece at a second time different from and non-simultaneous with the first time, wherein the material comprises ink.

18. A laser-based material processing system, the system comprising:
 a radiation source configured to produce a high-intensity radiation beam and direct the radiation beam along a radiation path toward a workpiece support;
 a positioning assembly over at least a portion of the workpiece support, the positioning assembly including an arm configured to move along a first axis, wherein the arm extends along a second axis generally normal to the first axis;
 a laser beam director carried by the positioning assembly and including one or more optical elements in the radiation path to direct the radiation beam toward the workpiece support;
 a dispensing unit carried by the positioning assembly to discharge a material toward the workpiece support, wherein the material comprises ink;
 a controller operably coupled to the positioning assembly, the laser beam director, and the dispensing unit, wherein the controller is configured to move the laser beam director and the dispensing unit relative to the workpiece support, and wherein (a) the radiation beam is directed at a first position of the workpiece support, and (b) the controller is configured to operate the dispensing unit such that the dispensing unit discharges material toward the first position of the workpiece support non-contemporaneous with the radiation beam being directed at the first position of the workpiece support.

19. The system of claim 18, further comprising a generally nonporous workpiece carried by the workpiece support, and wherein:
 the radiation beam directed at the workpiece support is configured to irradiate a portion of the workpiece; and
 the dispensing unit is positioned to discharge the material (a) onto the irradiated portion of the workpiece, (b) onto a portion of the workpiece outside the irradiated portion, or (c) both.

20. The system of claim 18 wherein:
 the laser beam director is carried by the arm and can move along the arm in a direction generally parallel with the second axis to position the laser beam director at desired X and Y coordinates on the workpiece support; and
 the dispensing unit is carried by the arm and can move along the arm in a direction generally parallel with the second axis to position the dispensing unit at desired X and Y coordinates on the workpiece support, and wherein the movement of the dispensing unit along the arm is coordinated with the movement of the laser beam director.

21. The system of claim 18 wherein the arm is a first arm, and wherein the positioning assembly further comprises a second arm configured to move along the first axis, the second arm extending along a third axis generally normal to the first axis and generally parallel with the second axis, and wherein:
 the laser beam director is carried by the first arm and can move along the first arm in a direction generally parallel with the second axis to position the laser beam director at desired X and Y coordinates on the workpiece support; and
 the dispensing unit is carried by the second arm and can move along the second arm in a direction generally parallel with the third axis to position the dispensing unit at desired X and Y coordinates on the workpiece support.

22. The system of claim 18 wherein the laser beam director and the dispensing unit are housed in a common enclosure.

23. The system of claim 22 wherein the dispensing unit and the laser beam director are integral components of a single processing unit in the common enclosure.

24. A method for manipulating workpieces, the method comprising:
 mounting a generally nonporous workpiece to a workpiece support;
 impinging a laser beam on the workpiece while the workpiece is on the workpiece support to modify the workpiece; and
 depositing a material onto the modified portion of workpiece with a dispensing unit separate from the laser beam while the workpiece is on the workpiece support and only non-contemporaneous with the laser beam being impinged on the workpiece, wherein the material comprises ink.

25. The method of claim 24 wherein depositing a material onto the workpiece further comprises depositing a material onto a portion of the workpiece outside the modified portion.

26. The method of claim 24 wherein:
 impinging a laser beam on the workpiece comprises modifying a first portion of the workpiece with the laser beam and modifying a second portion of the workpiece with the laser beam, the second portion being adjacent to and in contact with the first portion; and
 depositing a material onto the workpiece comprises depositing a first material onto the first modified portion of the workpiece and a second material onto the second modified portion of the workpiece.

27. A method for processing a workpiece, the method comprising:
 irradiating a generally nonporous workpiece with a laser beam positioned by a beam director carried at least in part by a support assembly over the workpiece, wherein irradiating the workpiece comprises irradiating a first portion of the workpiece and a second portion of the workpiece adjacent to and in contact with the first portion; and
 depositing a first material onto the first portion of the workpiece with a dispensing unit carried by the support assembly, and depositing a second material onto the second portion of the workpiece,
 wherein the first and second materials are only deposited onto the workpiece non-contemporaneous with the laser beam irradiating the workpiece.

* * * * *